United States Patent [19]

Baba et al.

[11] Patent Number: 4,792,832
[45] Date of Patent: * Dec. 20, 1988

[54] SUPERLATTICE SEMICONDUCTOR HAVING HIGH CARRIER DENSITY

[75] Inventors: Toshio Baba; Takashi Mizutani; Masaki Ogawa, all of Tokyo, Japan

[73] Assignee: NEC Corporation, Tokyo, Japan

[*] Notice: The portion of the term of this patent subsequent to Sep. 22, 2004 has been disclaimed.

[21] Appl. No.: 43,046

[22] Filed: Apr. 24, 1987

Related U.S. Application Data

[63] Continuation of Ser. No. 624,333, Jun. 25, 1984, Pat. No. 4,695,857.

[30] Foreign Application Priority Data

| Jun. 24, 1983 | [JP] | Japan | 58-113801 |
| Jul. 26, 1983 | [JP] | Japan | 58-136128 |
| Jul. 26, 1983 | [JP] | Japan | 58-136129 |
| Aug. 31, 1983 | [JP] | Japan | 58-159813 |
| Aug. 31, 1983 | [JP] | Japan | 58-159815 |
| Aug. 31, 1983 | [JP] | Japan | 58-159816 |

[51] Int. Cl.$^4$ .............. H01L 29/267; H01L 29/205; H01L 29/207
[52] U.S. Cl. .......................... 357/16; 357/4; 357/61; 357/63; 437/110; 437/133
[58] Field of Search .................... 357/4, 16, 61, 63

[56] References Cited

U.S. PATENT DOCUMENTS

| 3,626,257 | 12/1971 | Esaki et al. | 357/57 |
| 4,439,782 | 3/1984 | Holonyak, Jr. | 357/17 |
| 4,450,463 | 5/1984 | Chin | 357/30 |
| 4,695,857 | 9/1987 | Baba et al. | 357/16 |

OTHER PUBLICATIONS

"(Invited) MBE-Grown GaAs/N-AlGaAs Heterostructures and Their Application to High Electron Mobility Transistors", Hiyamizu et al., Japanese Journal Applied Physics, vol. 21, (1982), Supplement 21-1, pp. 161-168.

"Low Noise Normally On and Normally Off Two-Dimensional Electron Gas Field-Effect Transistors", Laviron et al., Applied Physics Letters 40(6), Mar. 15, 1982, pp. 530-532.

"A New Al$_{0.3}$Ga$_{0.7}$As/GaAs Modulation-Doped FET", Kopp et al., IEEE Electron Device Letters, vol. EDL-3, No. 5, May 1982, pp. 109-111.

Primary Examiner—William D. Larkins
Attorney, Agent, or Firm—Burns, Doane, Swecker & Mathis

[57] ABSTRACT

The superlattice type semiconductor material has a multilayered structure of first layers of semiconductor containing impurities and having a thickness thinner than electron or hole wavelength and second layers of semiconductor free from impurities or insulator having such a thickness that electrons or holes may penetrate by tunneling effect, the first and second layers being alternately piled. Electrons or holes distribute uniformly over the entire of the multilayered structure to show a property of uniform semiconductor material.

6 Claims, 9 Drawing Sheets

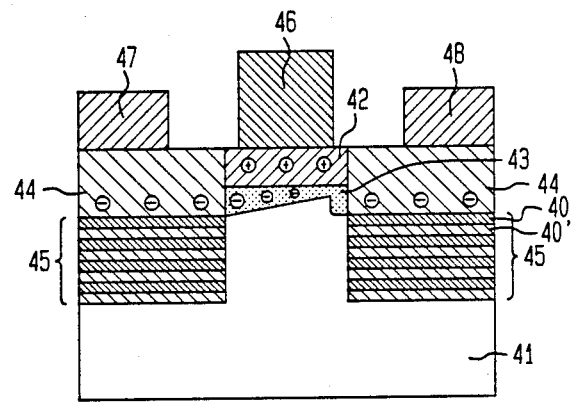
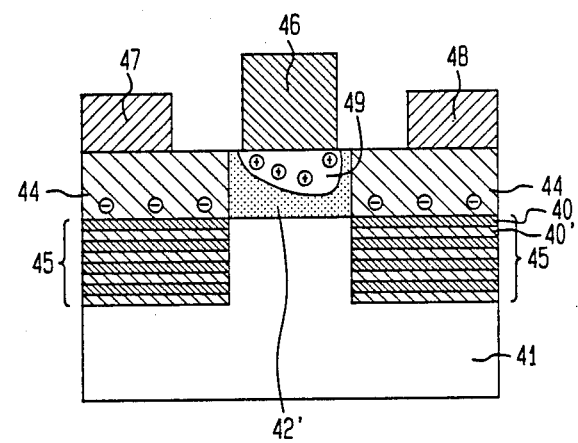

SUPERLATTICE SEMICONDUCTOR HAVING HIGH CARRIER DENSITY

This application is a continuation, of application Ser. No. 624,333, filed June 25, 1984 U.S. Pat. No. 4,695,857.

BACKGROUND OF THE INVENTION

1. Field of the Invention

This invention relates to a superlattice semiconductor structure in which doped impurities are activated at a high rate.

2. Disclosure of the Prior Art

The conventional method for doping impurities into compound semiconductors distributed uniformly impurities in the compound semiconductors having a uniform structure, similar to the doping of impurities into silicon (Si) or germanium (Ge). The conventional distribution of impurities in the compound semiconductors was uniform over the entirety of the semiconductor material. While some compound semiconductors such as GaAs and InP may achieve a high electron or hole density by the conventional techniques, other compound semiconductors can not obtain a high electron or hole density.

For example, for doping silicon as impurities into $Al_xGa_{1-x}As$ ($x=0.2 \sim 0.6$), the conventional technique grew $Al_xGa_{1-x}As$ containing Si as impurities on a GaAs substrate by a molecular beam epitaxy (MBE) process. If, however, the doping density of Si was made at $1 \times 10^{18}$ cm$^{-3}$ under a condition that the GaAs substrate was held at a temperature of 580° C., the activated electron density in the grown $Al_{0.3}Ga_{0.7}As$ layer was at most $1 \times 10^{17}$ cm$^{-3}$. This activated electron density could be increased to a value of $3 \times 10^{17}$ cm$^{-3}$, if the substrate temperature was raised at 730° C., but it was impossible to increase the electron density furthermore. This is based on the coexistence of Al and Ga atoms around the impurities atoms in the semiconductor layer. Due to the coexistence of AlGa atoms, even if the impurity doping density is increased further, lattice defects increase to compensate the increase of impurity density. The similar phenomenon was observed in cases where impurities were doped into GaAsP, GaAsSb or a mixture of Si and Ge. The coexistences of As and P, As and Sb and Si and Ge may make the number of impurity-related lattice defects increase to compensate the increase of impurity density.

An upper limit of hole density was also observed when acceptor impurities were doped into II-VI semiconductors having a band gap wider than 2.0 eV. Such upper limit was very low. Therefore, while the II-VI semiconductors could have a property of N-type conductivity, they could not have a property of P-type conductivity.

SUMMARY OF THE INVENTION

The primary object of the present invention is to provide a semiconductor structure in which doped impurities are activated at a high rate.

A further object of the present invention is to provide a superlattice semiconductor structure having a high carrier density.

According to one aspect of the present invention, there is provided a superlattice type semiconductor structure having a multilayered structure of first layers of semiconductor material having a thickness less than de Broglie wavelength for an electron and containing impurities and second layers of material having an electron affinity smaller than the electron affinity of the semiconductor material and having a thickness through which electrons may penetrate by tunneling effect. The first and second layers are alternately piled. As the semiconductor material, a semiconductor into which N-type impurities can be doped at high density and which involves no increase in impurity-related lattice defects is selected. The impurities doped into the semiconductor material are preferably isolated from the second layer by high purity semiconductor of the first layer. As the material of the second layer, a material is chosen which has no element to cause an increase in lattice defects.

According to another aspect of the present invention, there is provided a superlattice type semiconductor structure having a multilayered structure of first layers of semiconductor material having a thickness less than a de Broglie wavelength for a hole and containing impurities and second layers of material having a value of the sum of an electron affinity and a band gap larger than the sum of an electron affinity and a band gap of the semiconductor material and having a thickness through which holes may penetrate by tunneling effect. The first and second layers are alternately piled. As the semiconductor material of the first layer, a semiconductor into which P-type impurities can be doped at high density and which involves no element to cause an increase of impurity-related lattice defects is selected. The impurities in the first layer are preferably isolated from the second layer by the use of high purity semiconductor material for the first layers.

The electrons or carriers generated in and departing from the first layers penetrate through the second layers by tunneling effect to spread over the entirety of the multilayered structure. Therefore, the multilayered structure shows the property of a semiconductor having electrons or holes distributed uniformly. Here, impurities are contained in the first layers of a semiconductor material which results in no increase in lattice defects. Impurity-related lattice defects are caused by the coexistence of Al and Ga, the coexistences of As and P, As and Sb and Si and Ge and the usage of II-VI semiconductors having wide band gap as the second layer. Therefore, even if the material of the second layers involve such cause of the impurity-related lattice defects, a high electron or hole density can be obtained. Thus, any semiconductor material may have a high carrier density in accordance with the present invention.

BRIEF DESCRIPTION OF THE DRAWINGS

The above and further objects, features and advantages of the present invention will become apparent from the following detailed description of the embodiments taken in conjunction with the accompanying drawings, wherein:

FIG. 15 is a sectional view of a fifth example in which the superlattice type semiconductor material of the present invention is used;

FIG. 16 is a sectional view of a sixth example in which the superlattice type semiconductor material of the present invention is used;

DESCRIPTION OF THE PREFERRED EMBODIMENTS

Figure 1:
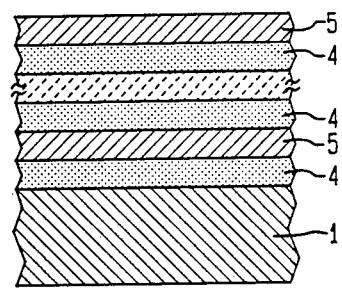
FIG. 1 is a sectional view of the first embodiment of the present invention.

The first embodiment shown in FIG. 1 has a superlattice semiconductor structure on a semiconductor substrate 1 such as gallium arsenide (GaAs). The superlattice structure is a multilayered structure of GaAs layers 4 having impurities of Si with an impurity density of $2.5 \times 1^{18}$ cm$^{-3}$ and aluminum arsenide (AlAs) layers 5 having a high purity. The GaAs layers 4 have a thickness less than an electron wavelength (about 100 Å) and greater than 5 Å. A typical thickness of the GaAs layers 4 is 13 Å. The AlAs layers 5 have such thickness through that an electron may penetrate by the tunneling effect. The maximum thickness is about 100 Å. The AlAs layers 5 should have a thickness of at least 5 Å.

Generally, in case of a multilayer structure of semiconductor layers having different electron affinities, if the thickness of semiconductor layers having a higher electron affinity is less than an de Broglie wavelength ($\lambda$) for an electron, then the quantum effect becomes dominant and then new energy levels (quantization levels) are formed. Furthermore, if the thickness of semiconductor layers having a lower electron affinity is so thin that electron at the quantization level may penetrate, then it becomes possible for electrons at the quantization level to move freely around the multilayer structure. The structure of this first embodiment satisfies this condition. The electrons generated in the GaAs layers and having the quantization level spread over the multilayer structure of the GaAs layers 4 and the AlAs layers 5. Therefore, by doping impurities into the GaAs layers 4 only, the electron density in the multilayer structure may be uniformly increased. The multilayer structure has similar energy band structure to an alloy of GaAs and AlAs or gallium aluminum arsenide (AlGaAs) into which n-type impurities could not be doped with high concentration in the prior art. In other words, the superlattice semiconductor structure of the first embodiment behaves like AlGaAs having a high donor impurity density.

The activation rate of the impurities (Si) doped into GaAs layer is almost 100 percent at room temperature. Electrons of the same quantity as the doped impurities are generated. Thus generated electrons spread over the entire multilayer structure of GaAs and AlAs layers at a new quantization level higher than the conduction band of GaAs with about 0.5 eV.

A molecular beam epitaxy (MBE) technique is employed as the process for growing each semiconductor layer. Silicon is doped to a density of $2.5 \times 10^{18}$ cm$^{-3}$. As a result, an active electron density of $2.0 \times 10^{18}$ cm$^{-3}$ is obtained at room temerature. This fact shows that almost 80 percent of doped silicon is activated. In case of the prior art in which silicon is doped into a semiconductor material of uniform AlGaAs, at most 10 percent of doped silicon is activated. Thus, according to the first embodiment, a very high electron concentration is achieved in an Al-Ga-As solid system.

Figure 2:
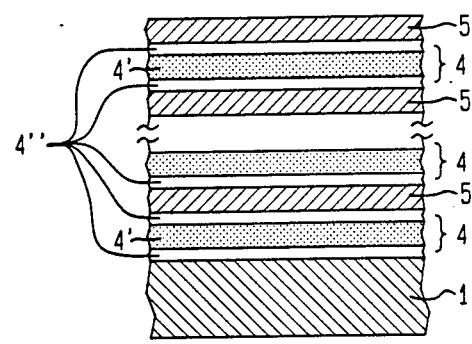
FIG. 2 is a sectional view of the second embodiment of the present invention.

A second embodiment of the present invention is shown in FIG. 2. The superlattice semiconductor structure formed on a semiconductor substrate 1 of GaAs, for example, is a multilayered structure of high purity AlAs layers 5 and impurity doped GaAs layers 4. Each of the GaAs layers 4 has such a structure that an impurity doped layer 4' having a thickness of 23 Å is sandwiched with non-doped layers 4" having a thickness of 6 Å. The thickness of the AlAs layers 5 is selected as 15 Å.

By using molecular beam epitaxy techniques, all the layers 4 and 5 are formed. The impurity silicon is doped into the doped layers 4 so that the density in the whole multilayer structure becomes $1 \times 10^{18}$ cm$^{-3}$. As a result, 90 percent of the doped silicon is activated at room temperature and $9 \times 10^{17}$ cm$^{-3}$ is obtained as an active electron density in the whole multilayer structure. The active electron density at 77° K is $5 \times 10^{17}$ cm$^{-3}$.

In spite of the fact that the minimum quantization level obtained in this structure is almost same energy level as the conduction band of the uniform structure of $Al_{0.3}Ga_{0.7}As$ the structure of this second embodiment has a doping efficiency three times as great as the conventional uniform $Al_{0.3}Ga_{0.7}As$. This high doping efficiency is based on the presence of the non-doped layers 4". The impurities in the doped layers 4' are isolated from the AlAs layers 5 by the non-doped layers 4". Therefore, the impurities are prevented from producing lattice defects which are generated when the n-type impurities exist around the mixture of Al and Ga. Furthermore, in measurement of light brightness generated by exposing the superlattice semiconductor structure to laser light at room temperature, the present embodiment show a brightness several times as the case of the conventional uniform structure of $Al_{0.3}Ga_{0.7}As$. Thus, the superlattice semiconductor structure of the present invention has a superior photoluminescence property.

Figure 3:
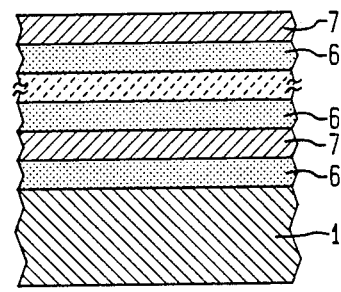
FIG. 3 is a sectional view of the third embodiment of the present invention.

The third embodiment shown in FIG. 3 employs Si as a semiconductor material having a large electron affinity and CaF$_2$ as a material having a small electron affinity. The Si layers 6 and CaF$_2$ layers 7 are alternately piled. Each of the Si layers 6 has a thickness of 14 Å, while each of the CaF$_2$ layers 7 has a thickness of 17 Å. Impurities of phosphorous are doped only into the Si layers 6 so as to have a doping density of $1 \times 10^{18}$ cm$^{-3}$ for the whole structure. The above-mentioned superlattice semiconductor structure is formed on a semiconductor substrate 1' of Si, for example. This structure shows a quantization level higher than the conduction band of Si by 0.2 eV and an active electron density of $9 \times 10^{17}$ cm$^{-3}$ for the whole multilayered structure.

Figure 4:
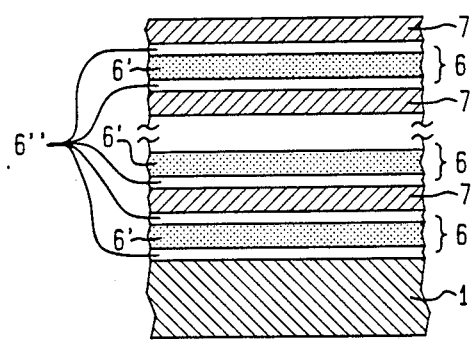
FIG. 4 is a sectional view of the fourth embodiment of the present invention.

The fourth embodiment shown in FIG. 4 has a structure similar to the third embodiment. The impurity doped Si layers 6, however, have such a multilayer structure that an impurity doped Si layer 6' of 4 Å is sandwiched by non-doped Si layers 6'' having a thickness of 5 Å. The impurity in the impurity doped layer 6' is phosphorous doped with a doping density of $1 \times 10^{18}$ cm$^{-3}$ for the whole superlattice structure.

According to this structure, the impurities in the doped layers 6' are isolated from the CaF$_2$ layers 7 by the non-doped layers 6'', causing no lattice effect which is generated by introducing impurities into CaF$_2$. Therefore, the activation rate of the doped impurity is improved compared to the third embodiment. In fact, the active electron density of the fourth embodiment shows the almost same value as the impurity doping density of $1 \times 10^{18}$ cm$^{-3}$.

Although the first to fourth embodiments are superlattice semiconductor structures of a lamination of two kind of materials, three or more kinds of materials may be laminated to form a multilayered structures. Furthermore, instead of silicon as the impurity in the GaAs layers, Te, Se, Sn or S may be substituted therefor.

As the method for preparing the superlattice semiconductor structure of the present invention, any kind of epitaxial growth technique may be used. Especially, a molecular beam epitaxy (MBE) technique and a metal organic chemical vapor deposition (MOCVD) technique are preferable, because their thickness controllabilities are superior to other techniques. Among of the two techniques, the MBE method is preferred, because it may achieve a multilayered structure having a steep transition region of several angstroms and it may be easily controlled by use of an electric computer.

Although combinations of GaAs-AlAs and Si-CaF$_2$ are used in the above-mentioned embodiments, other combinations may be equally employed. For example, it is impossible to obtain uniform materials of GaAsSb and GaAsP having a high electron density. This may be based on a fact that doped donor impurities produce many lattice defects under a coexistence of As and Sb or As and P. Therefore, the superlattice structure of this invention may be applied to prevent the coexistence of As and Sb or As and P and to provide GaAsSb or GaAsP having a high electron density. In case of GaAsSb, n-type impurity doped GaAs layers and non-doped GaSb layers are alternately piled. For GaAsP, n-type impurity doped GaAs layers and non-doped GaP layers are piled. The generation of lattice defects is observed in the mixture of Si and Ge when impurities are doped. For combination of Si and Ge, impurity doped Si layers and non-doped Ge layers should be piled alternately.

Other possible combinations of III-V semiconductors are InAs/AlAs, GaP/AlP, InP/AlAsSb, GaAs/InGaP, GaAs/GaPSb, GaSb/InAs, InAs/AlSb, GaSb/AlSb, GaAs/GaP, InP/InGaAs and InP/GaAsSb. Impurities should be doped into the material having a larger electron affinity and having no combination of AlGa, no combination of As and P and As and Sb. The possible combinations of III-V semiconductor and group IV semiconductor are Si/GaP, Ge/GaAs, Ge/AlAs and Ge/GaAlAs. Impurities may be doped into group IV semiconductors. The combinations of group IV semiconductors are Si/Ge and Si/C. Impurities may be doped into Si. Furthermore, the possible combinations of II-VI semiconductors are ZnSe/ZnS, CdSe/ZnTe and CdTe/HgTe. The combinations of III-V and II-VI semiconductors are GaAs/ZnSe and GaAs/ZnS.

In addition, the present invention may be applied to a combination of n-type impurity doped semiconductor and insulator. The applicable insulator are MgO-Al$_2$O$_3$ spinels which have lattice constants proportional to lattice constants of semiconductors, insulators of fluorides such as BaF$_2$ and CaF$_2$, and insulators of mixtures with fluoride such as Ba$_x$Ca$_{1-x}$F$_2$. In the above cases, as semiconductors, any semiconductor may be used except for those having low activation coefficient for doped impurities such as mixtures of Al and Ga, As and P and As and Sb. Especially, GaP/CaF$_2$ may be used to emit blue light. GaAs/CaF$_2$ and CdSe/CaF$_2$ may be used to laser diodes to emit blue light.

The present invention has another advantage applicable to a combination of materials having different lattice constants. The multilayered structure absorbs distortions at the interfaces of layers generated by different lattice constants. This absorption may be caused by lattice relaxation effect between the material having a thickness less than de Broglie wavelength ($\lambda$) for an electron and the material having such thickness that electrons penetrate by the tunneling effect. The de Broglie wavelength ($\lambda$) can be expressed by h/2m* E where h is Planck's constant, m* is effective mass of an electron and E is electron energy.

Figure 5:
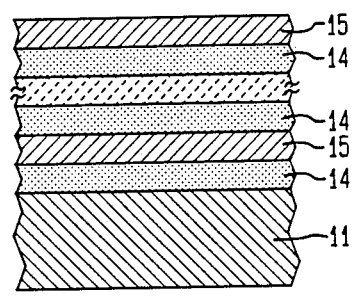
FIG. 5 is a sectional view of the fifth embodiment of the present invention.

According to the fifth embodiment of the present invention shown in FIG. 5, GaAs layers 14 doped with Be as P-type impurities and having a thickness of 5 Å and non-doped ZnSe layers 15 having a thickness of 15 Å are alternately piled on a semiconductor substrate 11 of GaAs, for example. The doping density of the impurity Be is $1 \times 10^{18}$ cm$^{-3}$ for the whole multilayered structure. The multilayered structure of GaAs layers 14 and ZnSe layers 15 are prepared by the molecular beam epitaxy technique.

The activation rate of Be in GaAs is amost 100 percent at room temperature. Therefore, almost all the impurities of Be doped into the GaAs layers 14 are activated to produce a hole density having almost the same value as the doping density. The activated holes spread over the whole multilayer structure at a quantization level lower than the valence band of GaAs by 0.7 eV. Although ZnSe has a larger value of the sum of electron affinity and band gap than GaAs, the electron affinities of ZnSe and GaAs are almost same. Therefore, no quantization level for electrons appears. The effective band gap of the multilayered structure is 2.1 eV.

Figure 6:
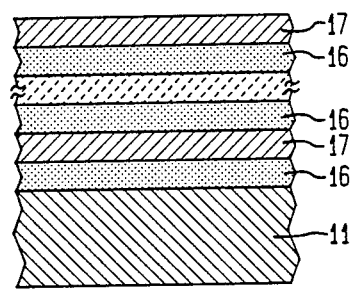
FIG. 6 is a sectional view of the sixth embodiment.

In the sixth embodiment shown in FIG. 6, CaF$_2$ is used for the layers 17 of material having no impurity and having a larger value of sum of electron affinity and band gap, in place of ZnSe used in the fifth embodiment. The CaF$_2$ layers 17 have a thickness of 15 Å. The P-type impurity doped layers 16 are GaAs layers having a thickness of 5 Å. The impurity doping density is $1 \times 10^{18}$ cm$^{-3}$ for the entire structure of the layers 16 and 17. The semiconductor substrate 11 is GaAs similar to the fifth embodiment.

New quantization level for holes is lower than the valence band of GaAs by 0.4 eV, while new quantization level for electrons is higher than the conduction band of GaAs by 1 eV, resulting in a band gap of 2.8 eV. The activated hole density is $1\times10^{18}$ which is almost same as the doping density of Be doped into the GaAs layers 14.

In the above two embodiments, the impurities are doped into the entire thickness of GaAs layers 14 and 16. It is possible to modify the GaAs layers 14 and 16 to such a structure that each impurity doped GaAs layer (14 and 16) is sandwiched by high purity GaAs layers to prevent the impurity from contacting with the impurity non-doped layers 15 and 17. Further, additional high purity GaAs layers may be inserted into the multilayered structure, if the additional layers have a thickness less than the debye length of electrons. More than three kinds of layers may be piled to obtain a superlattice semiconductor structure, if the laminated structure is constructed such that activated holes may be spread over the entirety of the laminated structure. The example of such combination is GaAs/AlAs/ZnSe which has a wider band gap than the combination of GaAs/ZnSe.

Many combinations other than those in the fifth and sixth embodiments are also applicable as the materials of the layers 14 to 17. The possible combination of II-VI semiconductors is ZnTe/CdSe. Other combinations of III-V and II-VI semiconductors are GaP/ZnS and InP/CdS. The combination of other semiconductors is $CuGaSe_2$/ZnSe. The other possible combinations of semiconductor and insulator are Si/MgO-$Al_2O_3$ spinel and GaP/$CaF_2$.

Impurities are doped into the material having the smaller value of sum of electron affinity and band gap. Such material should be a semiconductor. The impurities may be B, Al, Ga, In or Tl for group IV semiconductors such as Si and Ge; Be, Mg, Zn, Cd or C for III-V semiconductors such as GaAs and InP; and Au, Ag or Cu for II-VI semiconductors such as ZnTe and CdTe.

The layers of the impurity doped semiconductor should have a thickness less than the de Broglie wavelength ($\lambda$) for a hole or and greater than 5 Å. The layers of non-doped material should have such a thickness that holes may penetrate by tunneling effect. Typically, such thickness is selected as less than 20 Å but greater than 5 Å.

The materials having different lattice constants may be piled in accordance with the present invention. The distortion due to the mismatching of lattice constants is released at the interfaces of the layers in the multilayered structure according to the present invention. The multilayered structures of materials having different lattice constants also show semiconductor properties similar to the combinations of materials having matched lattice constants.

Next, some examples of semiconductor devices using the superlattice type semiconductor material of the present invention will be explained. The first to sixth examples are field effect transistors. The seventh example is a wide gap emitter (WGE) type bipolar transistor.

An example of a high speed semiconductor device is a field effect transistor (FET) using two-dimensional electron gas (2DEG) generated at the interface of the heterojunction between AlGaAs layer and GaAs layer. Such FET has a semi-insulator substrate of semiconductor on which a GaAs layer having a low impurity density and an N-type AlGaAs layer are grown in this order. Electrodes of source and drain are formed on the AlGaAs layer. A gate electrode is formed on the AlGaAs layer between the source and drain electrodes. Two-dimensional electron gas appears at the heterointerface between the GaAs and AlGaAs layers and is used as channel electrons, of the FET. Since the electrons in the heterojunction have high mobility, the FET may operate at high speed.

The AlGaAs layer in the conventional FET, however, had a uniform structure and contains N-type impurities uniformly. Therefore, the electron density in the AlGaAs could not be increased, resulting in a limitation of the number of electrons in the heterojunction and in a limited transconductance. Furthermore, if the impurities doped into the AlGaAs were increased, the number of lattice defects in the AlGaAs was also increased, causing an increase of trap centers or the like. The number of two-dimensional electrons was unstable, resulting in an unstable operation of the FET.

Figure 7:
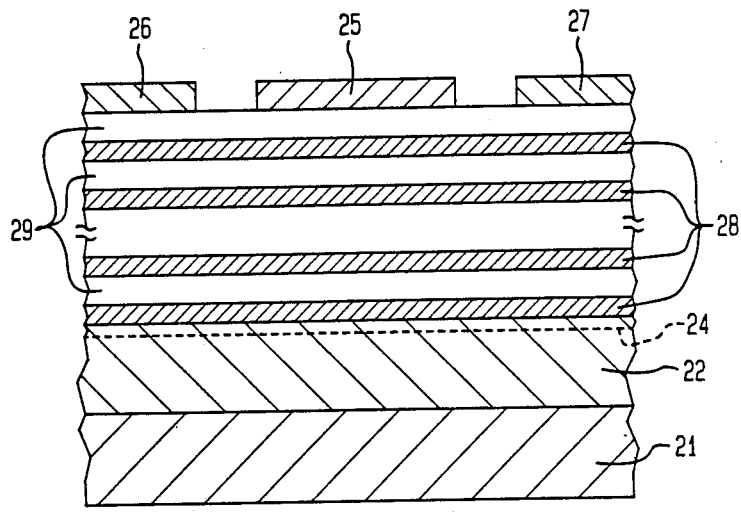
FIG. 7 is a sectional view of a first example in which the superlattice type semiconductor material of the present invention is used.

The first example shown in FIG. 7 improves the mutual conductance and the unstable operation by using the superlattice type semiconductor of the present invention as the AlGaAs layer. Namely, on a semi-insulator substrate 21 of GaAs, a high purity GaAs layer 22 is grown with a thickness of 1 $\mu$m. A multilayered structure is formed on the high purity GaAs layer 22 to form a superlattice type semiconductor material with high purity AlAs layers 28 each having a thickness less than 50 Å (for example, 23 Å) and N-type GaAs layers 29 containing Si as impurities with a doping density of $1.7\times10^{18}$ cm$^{-3}$ for the entirety of the multilayered structure and each having a thickness less than 100 Å (for example, 23 Å). The whole thickness of the multilayered structure is 500 Å. A Schottky gate electrode 25 is formed on the multilayered structure with aluminum. Source and drain electrodes 26 and 27 are formed on the multilayered structure on both sides of the Schottky gate electrode 25 with Au-Ge/Au alloy. The gate length is designed as 0.3 $\mu$m, the gate-source and gate-drain intervals are respectively as 0.3 $\mu$m. By this structure, two-dimensional electron gas 24 is formed on the surface of the high purity GaAs layer. The transconductance of the obtained FET is 450 ms/mm at 77° K.

Figure 8:
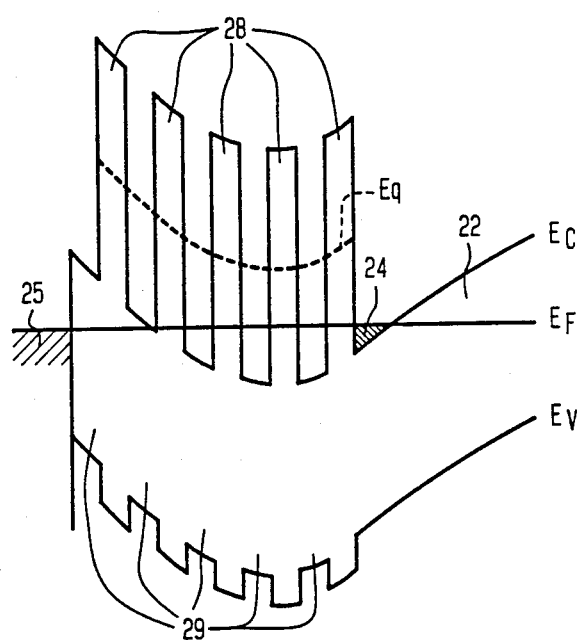
FIG. 8 is a diagram showing an energy band structure of a portion under the gate electrode of the first example.

The energy band structure of the portion under the gate electrode 25 is shown in FIG. 8 in which the same reference numerals as in FIG. 7 are used to show the parts corresponding to the parts in FIG. 7. "Eq" is a minimum quantization level of electrons newly generated in the multilayered structure of the layers 28 and 29.

Since a new quantization level Eq of the multilayered structure is at an energy position higher than the edge $E_c$ of the conduction band of the high purity GaAs, a part of electrons at the quantization level gather at the interface between the high purity GaAs layer 22 and the AlAs layer 28 on the side of the GaAs layer 22 to form a two-dimensional electron gas 24.

Electrons generated in the N-type GaAs layers 29 spread over the entirety of the multilayered structure, because each of the N-type GaAs layers 29 has a thickness less than an de Broglie wavelength ($\lambda$) for an electron and each of the AlAs layers 28 has such a thickness such that electrons may penetrate by tunneling effect. Here, the N-type impurities are contained only in the GaAs layers 29 and not in the AlAs layers 28. Therefore, the N-type impurities do not increase lattice defects in the multilayered structure. Thus, the multilayered structure may have a very high electron density without increase of lattice deffects.

In other words, the multilayered structure has very few trap centers of electrons. Therefore, the quantity of two-dimensional elections is not changed by an exposure to light or injection of hot electrons, resulting in a stable operation when used as an FET. In addition, the change in the two-dimensional electron density is very little if the operating temperature is changed. The design of the FET for operating at low temperature is easy. The reproducibility is also superior.

Figure 9:
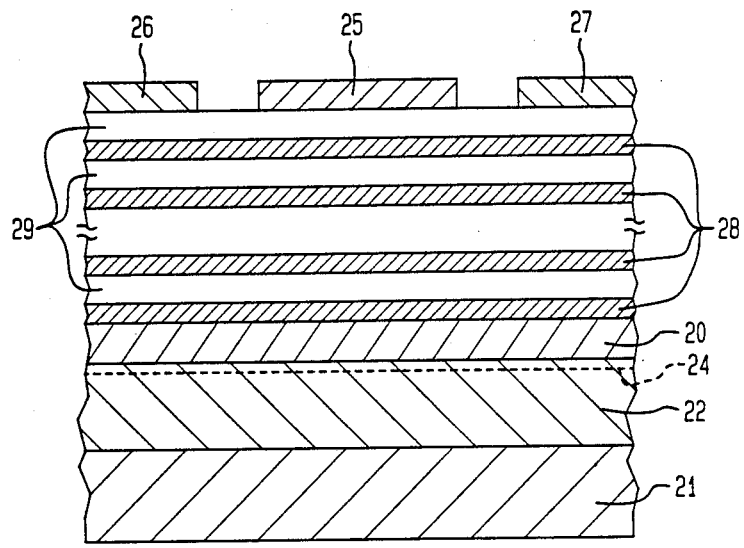
FIG. 9 is a sectional view of a second example in which the superlattice type semiconductor material of the present invention is used.
Figure 10:
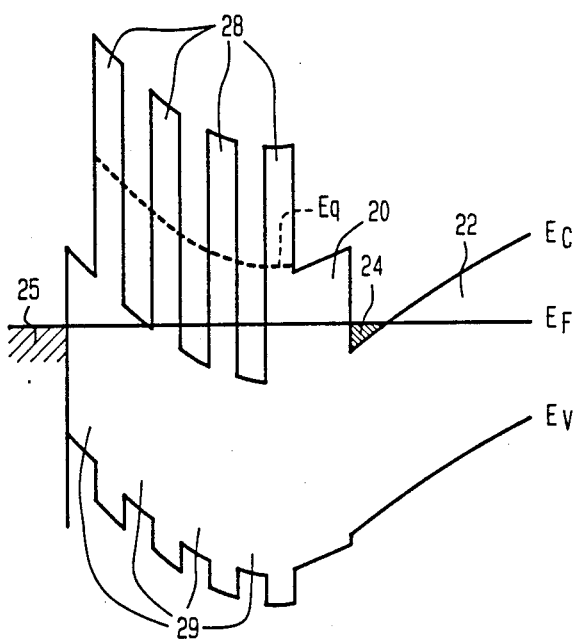
FIG. 10 is a diagram showing an energy band structure of a portion under the gate electrode of the second example.

The second example is shown in FIGS. 9 and 10 with the same reference numerals as the first example to show the corresponding parts. The difference from the first example is an addition of a spacer layer 20 between the high purity GaAs layer 22 and the lowest AlAs layer 28 in the multilayered structure. The spacer layer 20 is formed of a material having an electron affinity smaller than the high purity GaAs layer 22, and containing a very little quantity of impurities. An example of the spacer layer 20 is a layer of $Al_{0.3}Ga_{0.7}As$ having a thickness of 100 Å.

Two-dimensional electron gas 24 is isolated from the N-type GaAs layer 29 by the spacer layer 20. Therefore, the scattering rate of two-dimensional electrons due to the ionized impurities is lowered. By a suitable selection of material as the spacer layer 20, the heterointerface between the spacer layer 20 and high purity GaAs layer 22 may be easily smoothed. From these two reasons, the mobility of two-dimensional electrons is larger than the first example.

A process for manufacturing the second example will be explained. A molecular beam epitaxy (MBE) technique is employed for growing semiconductor layers. After a high purity GaAs layer 22 having a thickness of 1 µm is grown on the semi-insulator substrate 21 of GaAs, a layer of high purity $Al_{0.3}Ga_{0.7}As$ is grown as the spacer layer 20 with a thickness of 100 Å on the high purity GaAs layer 22. On the spacer layer 20, a multilayered structure having a total thickness of 400 Å is formed with grown layers 28 of high purity AlAs each having a thickness of 20 Å and grown layers 29 of N-type GaAs each having a thickness of 23 Å. The impurities in the N-type GaAs layers 29 are Si and are doped with a doping density of $2.4 \times 10^{18}$ cm$^{-3}$ for the entire multilayered structure. A Schottky gate electrode 25 is formed on the multilayered structure with aluminum. Source and drain electrodes 26 and 27 are formed on the multilayered structure on both sides of the Schottky gate electrode 25 with alloys of Au-Ge/Au.

As a result, a high mobility of 100,000 cm²/v.s is obtained at 77° K. Under a condition of a gate length of 0.3 µm, a gate-source interval of 0.3 µm and a gate-drain interval of 0.3 µm, a transconductance of 500 ms/mm is obtained at 77° K. Any change in electrical characteristics is not observed by an exposure to light and an application of high electric field.

As modifications of the first and second example, the electrodes 25, 26 and 27 may be contacted with the AlAs layer 29 in place of the n-type GaAs layer 28. Between the Schottky gate electrode 25 and the multilayered structure, additional suitable semiconductor layer having a thickness of 20 Å to 300 Å may be interposed. The interposed semiconductor layer is preferably selected from N-type GaAs and AlGaAs. In place of the Schottky gate electrode 25, a PN junction type gate electrode, quasi-Schottky gate electrode, a camel gate electrode or an insulated gate electrode may be employed.

The third and fourth examples shown in FIGS. 11 to 14 have a superlattice type semiconductor material of the present invention to which a high purity GaAs layer is interposed between the superlattice structure and an attached gate electrode.

Figure 11:
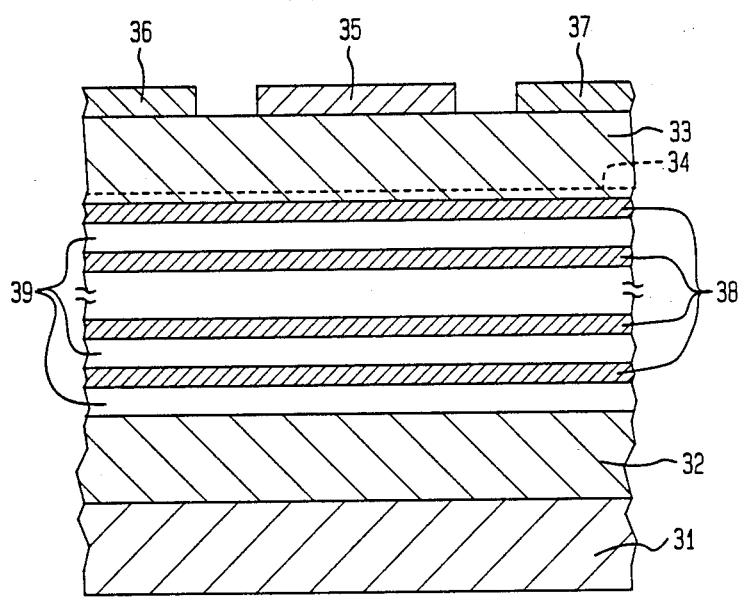
FIG. 11 is a sectional view of a third example in which the superlattice type semiconductor material of the present invention is used.
Figure 12:
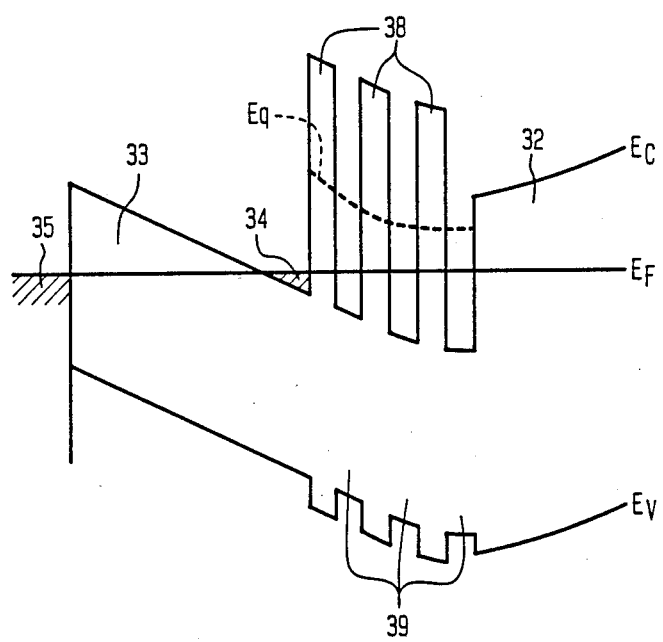
FIG. 12 is a diagram showing an energy band structure of a portion under the gate electrode of the third example.

According to the third example shown in FIGS. 11 and 12, a blocking layer 32 of high purity $Al_{0.3}Ga_{0.7}As$ having a thickness of 0.5 µm is grown on a semi-insulator substrate 31 of GaAs. A multilayered structure having a total thickness of 190 Å is formed on the blocking layer 32 with high purity AlAs layers 38 having a thickness less than 50 Å (for example, 15 Å) and N-type GaAs layers 39 having a thickness less than 100 Å (for example, 23 Å). The impurities in the N-type GaAs layers 39 are Si doped with a density of $1.7 \times 10^{18}$ cm$^{-3}$ for the whole multilayered structure. A high purity GaAs layer 33 having a thickness of 0.1 µm is grown on the multilayered structure. Aluminum is attached to the high purity GaAs layer 33 to form a Schottky gate electrode 35. Source and drain electrodes 36 and 37 are formed on the high purity GaAs layer 39 on both sides of the Schottky gate electrode 35 with Au-Ge/Au alloy. Under this structure, a two-dimensional electron gas is generated at the interface between the multilayered structure and the high purity GaAs layer 33 on the side of the high purity GaAs layer 33. The gate length is 0.3 µm and the gate-source and gate-drain intervals are respectively 0.3 µm. A transconductance of 250 ms/mm is obtained at 77° K. FIG. 12 is a diagram showing an energy band structure under the Schottky gate electrode 35. "Eg" is the lowest quantization level of electron of the multilayered structure of N-type GaAs layers 39 and high purity AlAs layers 38.

Electrons generated in the N-type GaAs layers 39 spread over not only the N-type GaAs layers 39 but also the high purity AlAs layers 38, resulting in a uniform distribution over the entirety of the multilayered structure. Impurities, however, are contained in the N-type GaAs layer 39 only. Therefore, the multilayered structure may have a uniform high electron density without increase in number of lattice defects. In other words the multilayered structure contains a small number of trap centers. Due to this small number of trap centers, the change of the number of two-dimensional electrons in response to an exposure to light or an application of electric field is very small, resulting in a stable operation.

Figure 13:
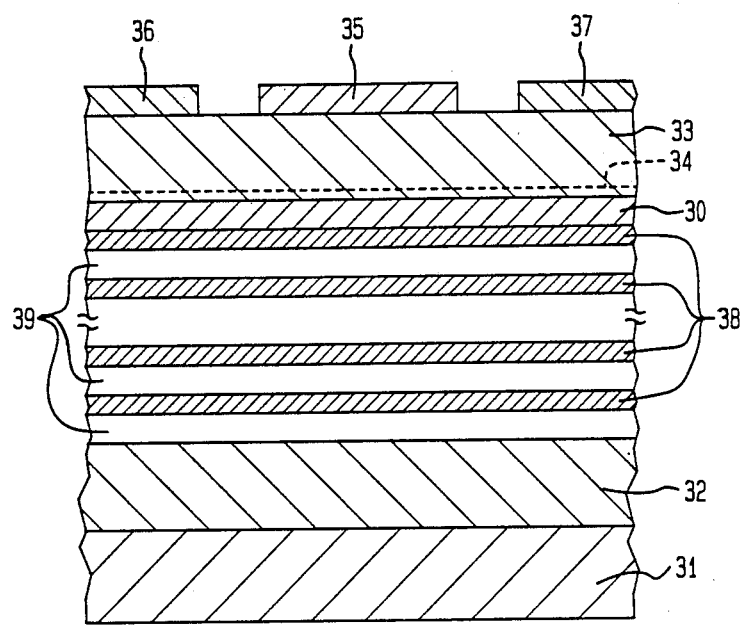
FIG. 13 is a sectional view of a fourth example in which the superlattice type semiconductor material of the present invention is used.
Figure 14:
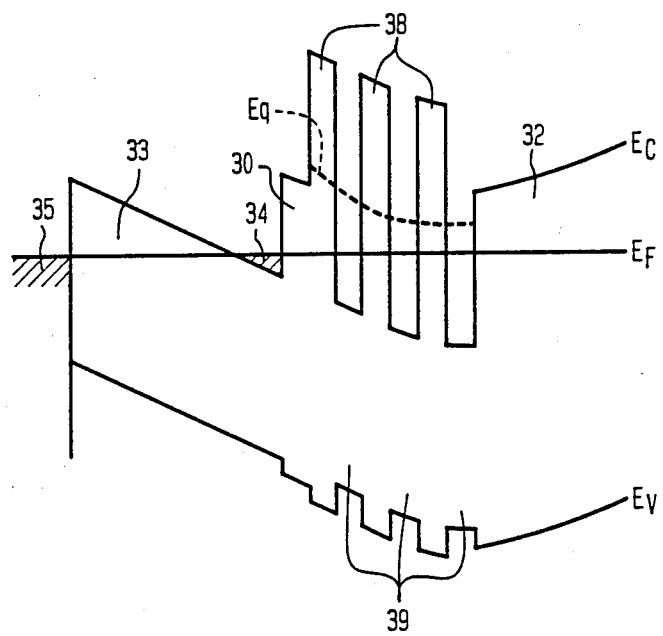
FIG. 14 is a diagram showing an energy band structure of a portion under the gate electrode of the fourth example.

According to the fourth example shown in FIGS. 13 and 14, a spacer layer 30 is interposed between the high purity GaAs layer 33 and the multilayered structure. The spacer layer 30 should be a material having an electron affinity smaller than a high purity GaAs of the layer 33. An example of the spacer layer 30 is a layer of high purity $Al_{0.3}Ga_{0.7}As$ having a thickness of 100 Å. The multilayered structure is formed with a total thickness of 170 Å by a molecular beam epitaxy (MBE) process. High purity AlAs layers 38 each having a thickness of 20 Å and N-type GaAs layers 39 each having a thickness of 23 Å are piled. The impurities in the N-type GaAs layers 39 are Si and are doped with a doping density of $2.4 \times 10^{18}$ cm$^{-3}$ for the entire multilayered structure. The other structure is same as the third example. A transconductance of 300 ms/mm is obtained at 77° K.

The interval between the two-dimensional electron gas 34 and the N-type GaAs layer 39 is widened by the spacer layer 30. Therefore, the rate of the two-dimensional electrons scattered by the ionized impurities is made decreased by the presence of the spacer layer 30. Due to this fact, the mobility of the secondary electrons is higher than the third example.

In these third and fourth examples, other type of gate electrodes such as a PN junction gate type, a quasi-Schottky gate type, a camel gate type and an insulated gate type may be employed in place of the Schottky gate electrode 35. The semi-insulator substrate 31 may be an insulator such as spinels and $CaF_2$.

The fifth and sixth examples shown in FIGS. 15 and 16 are field effect transistors (FET) in which the superlattice type semiconductor material is used in source and drain regions. For high speed operation of FET's, a reduction of stray resistances between gate and source electrodes and between gate and drain electrodes is important, as well as the reduction of gate length. The superlattice type semiconductor material is used to reduce the stray resistances in the fifth and sixth example.

The FET according to the fifth example has a semi-insulator substrate 41 of GaAs. A layer 42 of N-type $Al_{0.3}Ga_{0.7}As$ having an impurity density of $1 \times 10^{18}$ cm$^{-3}$ and a thickness of 500 Å is formed on a portion of the substrate 41. At the interface of the substrate 41 and the layer 42, a two-dimensional electron gas is generated on substrate side of the interface. The electron gas is used as a channel region 43. The conductivity of the channel region 43 is controlled by a gate voltage applied to the gate electrode 46 attached to the layer 42. The material of the gate electrode 46 is aluminum. On both sides of the layer 42 and the channel region 43, superlattice type semiconductor region 45 and N-type GaAs regions 44 are formed on the substrate 41. The N-type GaAs regions 44 has a donor density of $2 \times 10^{18}$ cm$^{-3}$. The superlattice type regions 45 have multilayered structures of layers 40 of high purity AlAs having a thickness of 20 Å and layers 40' of N-type GaAs containing silicon as donor impurities with a concentration of $2 \times 10^{18}$ cm$^{-3}$ and having a thickness of 20 Å. The total thickness of the multilayered structure is 280 Å. The upper most layer is selected as the layer 40 of high purity AlAs. Source and drain electrodes 47 and 48 of Au-Ge alloy are formed on the N-type GaAs regions 44.

In the superlattice type semiconductor regions 45, electrons generated in the layers 40' may move beyond the junction between the layers 40 and 40' and beyond the region 45. Due to the energy band structure at the heterojunction between the regions 44 and 45, the electrons are collected on the bottom surface of the region 44. The conductivity of the bottom surface of the region 44 is enhanced by thus collected electrons. The carriers injected from the drain electrode 48 flow to the source electrode 47 through the collected electron region under the drain electrode 48, the channel region 43 and the collected electron region under the source electrode 47. As a result, the resistances between the gate and source electrodes and between the gate and drain electrodes are decreased, resulted in a superior high speed operability. Furthermore, there is no electron spreading out in the substrate 41, resulted in a excellent saturation characteristic.

The sixth example shown in FIG. 16 is a Schottky gate type field effect transistor. A layer 42' of N-type GaAs having a donor density of $2 \times 10^{17}$ cm$^{-3}$ and a thickness of 2000 Å is formed on a portion of a semi-insulator substrate 41. A gate electrode 46 of aluminum is attached to the layer 42' to form a Schottky barrier junction. A depletion layer 49 extends from the Schottky barrier junction into the layer 42'. The width of the depletion layer 49 is controlled by the voltage applied to the gate electrode 46 to change the conductivity of the layer 42'. On both sides of the layer 42 and the portion of the substrate 41, superlattice type semiconductor regions 45 and N-type GaAs regions 44 are formed as same as the fifth example.

The Schottky gate type field effect transistor of this sixth example has the same structures in the source and drain regions as the fifth example. Therefore, the same high speed operability is also obtained, similar to the fifth example.

Figure 17:
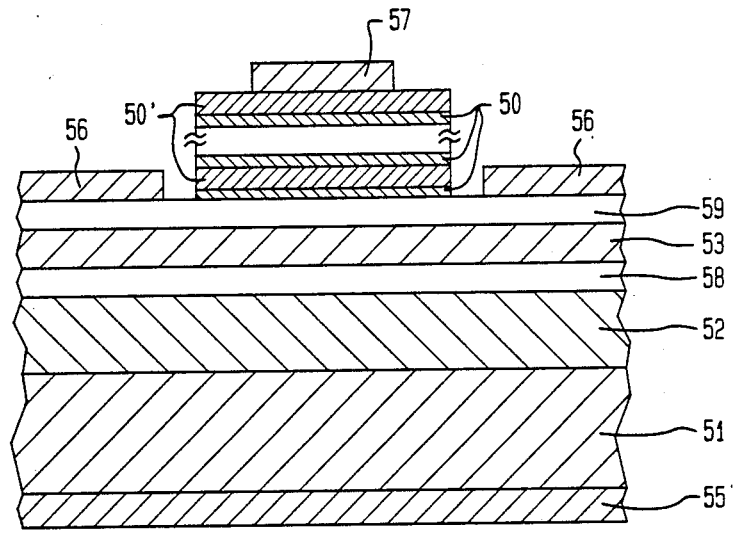
FIG. 17 is a sectional view of a seventh example in which the superlattice type semiconductor material of the present invention is used.
Figure 18:
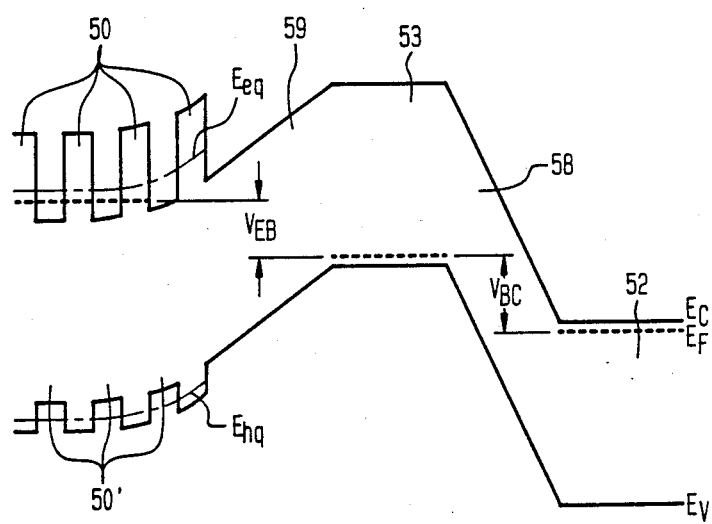
FIG. 18 is a diagram showing an energy band structure of a portion under the emitter electrode of the seventh example.

The seventh example shown in FIGS. 17 and 18 is a wide gap emitter (WGE) transistor which is a bipolar transistor operable at high speed. A semiconductor material having a wide band gap is employed as a material of emitter region. A heterojunction is formed at the interface between base and emitter regions. Due to this heterojunction, a high barrier for holes in base region is formed between base and emitter regions of the NPN transistor. The injections of holes from base region to emitter region are restrained. Therefore, hole density may be increased, while a high injection efficiency of electrons to be injected from emitter region to base region is maintained. As a result, a small base resistance is obtained. Further, due to the small base resistance, a base width may be decreased. Thus, the WGE transistor has a structure suitable for very high speed operation. In such WGE transistor, the superlattice type semiconductor material may be used as a material for emitter region having high carrier concentration and a low resistance.

The WGE example according to the seventh transistor may be formed by use of a molecular beam epitaxy (MBE) process. On an N$^+$-type GaAs substrate having a donor density of $1 \times 10^8$ cm$^{-3}$, a collector layer 52 of N$^+$-type GaAs having a donor density of $5 \times 10^{18}$ cm$^{-3}$ and a thickness of 0.5 μm, a collector depletion layer 58 of high purity GaAs having a thickness of 0.5 μm, a base layer 53 of P$^+$-type GaAs having an acceptor density of $2 \times 10^{19}$ cm$^{-3}$ and a thickness of 500 Å and an emitter depletion layer 59 of high purity GaAs having a thickness of 600 Å are formed in this order. Thereafter, on the emitter depletion layer 59, an emitter region is formed with a superlattice type semiconductor material. This superlattice type semiconductor has a multilayered structure of high purity AlAs layers 50 each having a thickness of 15 Å and N$^+$-type GaAs layers 50' each having a thickness of 23 Å. The donor impurities in the N$^+$-type GaAs layers 50' are Si and are doped with a doping density of $1 \times 10^{19}$ cm$^{-3}$ for the entire multilayered structure. On the emitter region, an emitter electrode 57 is formed with Au-Ge/Au alloy. On the emitter depletion layer 59, base electrodes 56 is formed with AuZn alloy. On the back surface of the N$^+$-type GaAs substrate 51, a collector electrode 55 is formed with In.

The energy band structure of thus obtained WGE transistor is as shown in FIG. 18. "Eq" is the lowest quantization level of electron in the multilayered structure. "Ehq" is the lowest quantization level of holes in the multilayered structure.

The AlAs layers 50 has a thickness through which electrons may penetrate by tunneling effect and the N$^+$-type GaAs layers 50' has a thickness less than an electron wavelength. The electron affinity of GaAs is larger than AlAs. Therefore, electrons generated in the N+-type GaAs layers 50' spread over the entire multilayered structure to be distributed uniformly. The multilayered structure behaves as an N-type AlGaAs semiconductor having a wide band gap. Therefore, while the injection efficiency of electrons from emitter region to base region is high, the injection of holes from base to emitter is restrained. As above-explained, the WGE transistor of the seventh example has a structure suitable for high speed operation.

The WGE transistor of the seventh example has another structure suitable for high speed operation. A collector depletion layer 58 and an emitter depletion layer 59 are provided between the collector and base regions 52 and 53 and between the base region 53 and the emitter region of multilayered structure. These depletion layers 58 and 59 are high purity GaAs layer. Due to the insertion of these depletion layers 58 and 59, the impurity densities of the collector and base regions 52 and 53 and the emitter region may be increased without lowering the breakdown voltages therebetween, resulted in small resistances of the collector, base and emitter regions. In addition, the depletion layers at the interfaces between the collector and base regions and between the base and emitter regions extend only in the depletion layers 58 and 59, resulted in small collector-base and base-emitter capacitances.

Furthermore, because neither ionized donor impurity nor ionized acceptor impurity exists in the collector and emitter depletion layers 58 and 59, the diffusion constant and mobility of carriers in the depletion layer generated at interfaces between collector and base regions and base and emitter regions are very large.

The base width is conventionally determined by the depth of alloy between the base electrode and the base region. The transistor according to the seventh example has the collector and emitter depletion layers 58 and 59. Therefore, if the width of the base region 53 is made narrow, the alloy connecting the base electrode 56 to the base region is prevented from reaching the base-collector junction by the emitter and collector depletion layers 58 and 59. In other words, the width of the base region may be made narrow.

These features greatly improve the high frequency characteristics of the WGE transistor according to the seventh example. In fact, the WGE transistor of the seventh example achieves a delay time of 23 $\mu$sec.

The WGE transistor of the seventh example may be formed of Si by using a multilayered structure of impurity doped Si layers and CaF$_2$ layers as a material of the emitter region. The PNP-type WGE transistor may be obtained by using a multilayered structure of semiconductor layers containing P-type impurities and layers of semiconductor or insulator having a value of sum of electron affinity and band gap larger than the impurity doped semiconductor and by reversing the conductivity type of the collector and base regions 52 and 53 and the substrate 51. The interface between the superlattice type semiconductor and the emitter depletion layer 59 allows the mismatching of lattice constants. Therefore, any kind of superlattice type semiconductor having wide band gap may be employed as a material for the emitter region.

Although several semiconductor devices are explained in the above as examples in which the superlattice type semiconductor material of the present invention is used, it would be apparent for the skilled in the art that the superlattice type semiconductor material of the present invention may be used in any kind of semiconductor device.

What is claimed is:

1. A superlattice type semiconductor having a multilayered structure of alternately piled first and second layers, said first layers being made of a semiconductor which does not involve aluminum, a combination of arsenic and phosphorus, a combination of arsenic and antimony and a combination of silicon and germanium as elements, each of said first layers having a thickness with a range from 5 Å to 100 Å and having an N-type impurity doped region sandwiched by impurity-free regions, said impurity-free regions contacting said second layers, said second layers being impurity-free and made of a material having an electron affinity smaller than said semiconductor and each of said second layers having a thickness within a range from 5 Å to 100 Å.

2. A superlattice type semiconductor as claimed in claim 1, wherein the combination of said semiconductor and said material is selected from a group of combination of GaAs/AlAs, GaAs/GaSb, GaAs/GaP, InAs/AlAs, GaP/AlP, InP/AlAsSb, GaAs/InGaP, GaAs/GaPSb, GaSb/InAs, InAs/AlSb, GaSb/Alsb, InP/InGaAs and InP/GaAsSb.

3. A superlattice type semiconductor as claimed in claim 1, wherein the combination of said semiconductor and said material is selected from a group of combinations of Si/Ge, Si/GaP, Ge/GaAs, Ge/AlAs, Ge/GaAlAs, Si/c and Si/CaF$_2$.

4. A superlattice type semiconductor as claimed in claim 1, wherein the combination of said semiconductor and said material is elected from a group of combinations of ZnSe/ZnS, CdSe/ZnTe, CdTe/HgTe, GaAs/ZnSe and GaAs/ZnS.

5. A superlattice type semiconductor as claimed in claim 1, wherein said material is selected from a group of MgO-Al$_2$O$_3$ spinels, BaF$_2$, CaF$_2$ and a mixture of BaF$_2$ and CaF$_2$.

6. A superlattice type semiconductor as claimed in claim 5, wherein the combination of said semiconductor and said material is selected from a group of combinations of Si/CaF$_2$, GaP/CaF$_2$, GaAs/CaF$_2$ and CdSe/CaF$_2$.

* * * * *